United States Patent [19]

Ward

[11] 4,036,739

[45] * July 19, 1977

[54] CATALYTIC CRACKING PROCESS USING AMMONIA-STABLE ZEOLITE CATALYST

[75] Inventor: John W. Ward, Yorba Linda, Calif.

[73] Assignee: Union Oil Company of America, Los Angeles, Calif.

[*] Notice: The portion of the term of this patent subsequent to Dec. 16, 1992, has been disclaimed.

[21] Appl. No.: 598,114

[22] Filed: July 22, 1975

Related U.S. Application Data

[63] Continuation-in-part of Ser. No. 406,684, Oct. 15, 1973, Pat. No. 3,929,672, which is a continuation-in-part of Ser. No. 191,123, Oct. 20, 1971, abandoned, and Ser. No. 236,185, March 20, 1972, Pat. No. 3,781,199.

[51] Int. Cl.² .................... C10G 11/04; B01J 29/12
[52] U.S. Cl. ................... 208/120; 252/455 Z
[58] Field of Search ......................... 208/120

[56] References Cited

U.S. PATENT DOCUMENTS

| | | | |
|---|---|---|---|
| 3,257,310 | 6/1966 | Plank et al. | 208/120 |
| 3,402,996 | 9/1968 | Maher et al. | 423/328 |
| 3,449,070 | 6/1969 | McDaniel et al. | 423/328 |
| 3,457,191 | 7/1969 | Erickson et al. | 252/455 |
| 3,644,200 | 2/1972 | Young | 208/120 |
| 3,926,780 | 12/1975 | Ward | 208/111 |

Primary Examiner—Delbert E. Gantz
Assistant Examiner—G. E. Schmitkons
Attorney, Agent, or Firm—Lannas S. Henderson; Richard C. Hartman; Dean Sanford

[57] ABSTRACT

Highly active, hydrothermally stable and ammonia-stable Y zeolite compositions are disclosed, which compositions are useful as adsorbents, hydrocarbon conversion catalysts, and as acidic supports for catalytic metals. The stabilized Y zeolite composition is prepared from a sodium Y zeolite by a novel sequence of: (1) partial exchange of ammonium ions for sodium ions, (2) steam calcination under controlled conditions of time, temperature and steam partial pressure, and (3) further ion exchange of ammonium ions for sodium ions to reduce the final $Na_2O$ content to below about one weight-percent.

10 Claims, 2 Drawing Figures

CATALYTIC CRACKING PROCESS USING AMMONIA-STABLE ZEOLITE CATALYST

RELATED APPLICATIONS

This application is a continuation-in-part of Ser. No. 406,684, filed Oct. 15, 1973, now U.S. Pat. No. 3,929,672 in which turn is a continuation-in-part of Ser. No. 191,123, filed Oct. 20, 1971, now abandoned, and of Ser. No. 236,185, filed Mar. 20, 1972, now U.S. Pat. No. 3,781,199.

BACKGROUND AND SUMMARY OF THE INVENTION

In acid-catalyzed hydrocarbon conversions, the use of catalysts based on various forms of Y zeolite has become widespread. For such purposes, the most desirable forms of Y zeolite are those wherein the original zeolitic sodium ions have been replaced by less basic cations such as hydrogen ions, or polyvalent metal ions such as magnesium or rare earth metal ions. Still another desirable form is sometimes referred to in the literature as the "decationized" form, which it now appears may actually consist of a form in which part of the exchange sites are actually cation deficient and in which another portion is satisfied by hydrogen ions. To product the hydrogen and/or decationized forms, the general procedure is to exchange most or all of original sodium ions with ammonium ions, and the resulting ammonium zeolite is then heated to decompose the zeolitic ammonium ions, first forming a hydrogen zeolite, which may upon further heating be at least partially converted by dehydroxylation to the truly decationized form. The hydrogen form, the decationized form, and the mixed hydrogen-decationized forms will be referred to hereinafter collectively as "metal cation deficient" Y zeolites.

A problem which was encountered at an early stage in the development of Y zeolite catalysts was that of thermal and hydrothermal stability. The metal-cation-deficient zeolites were found to be in general more active than the polyvalent metal forms, but did not display the hydrothermal stability of the latter. "Hydrothermal stability" refers to the ability to maintain crystallinity and surface area upon calcination after exposure to water vapor, or upon exposure to water vapor at high temperatures. Severe hyrothermal conditions are often encountered in hydrocarbon conversion processes, either as a result of inadvertent process upsets, or during oxidative regeneration of the catalysts, or in other ways. For these and other reasons most commercial processes such as cracking or hydrocracking utilize a polyvalent metal-stabilized form of the zeolite, even though some degree of activity is thereby sacrificed.

In recent years however this picture has changed somewhat. Several forms of stabilized metal-caton-deficient Y zeolites appear to be available, or at least described in the literature. A common feature involved in the manufacture of such stabilized zeolites appears to be a calcining step, in which an ammonium form of the zeolite is calcined at a relatively high temperature, usually above about 1000° F, either in the presence or absence of added steam. This calcination appears to bring about in varying degrees a removal of lattice alumina from the anionic crystal structure, with a resultant shrinkage in the unit cell size to values ranging between about 24.2 and 24.5 A. Exemplary disclosures of such procedures can be found in U.S. Pat. Nos. 3,293,192 to Maher et al., 3,449,070 to McDaniel et al., 3,354,077 to Handsford, 3,493,519 to Kerr et al., 3,513,108 to Kerr, and 3,506,400 to Eberly et al. My investigations have shown that while the procedures described in each of the foregoing patents are capable of producing a metal-cation-deficient Y zeolite of improved hydrothermal stability, none of such procedures result in a product having the optimum combination of activity, hydrothermal stability, and ammonia stability of the zeolites produced herein.

It should be noted that ammonia stability is in many cases as important as hydrothermal stability. In cracking and hydrocracking processes, the feedstocks often contain substantial quantities of nitrogen compounds which are largely converted to ammonia. These nitrogen compounds, as well as the ammonia, not only suppress catalytic activity in varying degrees, but in many cases, especially when water is also present, tend to destroy surface area and crystallinity of the best steam-stabilied Y zeolite catalysts of the prior art. Ammonia stability is also essential in catalysts which may, after partial deactivation by metal agglomeration, to be subjected to the aqueous ammonia rejuvenation procedure described in U.S. Pat. No. 3,692,692. The ability of the stabilized zeolites described herein to withstand the combined destructive effects of water and ammonia in contrast to other steam-stabilized Y zeolites has not yet been explained.

Briefly summarizing, the critical steps in the manufacture of the stabilized zeolites of my invention are as follows:

1. The initial sodium Y zeolite is subjected to a preliminary ammonium ion exchange to replace most, but not all, of the zeolitic sodium with ammonium ions.
2. The resulting ammonium-sodium zeolite is then calcined in the presence of steam under controlled conditions of time, temperature and steam partial pressure correlated to reduce the unit cell size of the zeolite to between about 24.40 and 24.64 A.
3. The steam-calcined zeolite is then re-exchanged with ammonium salt to replace at least 25 percent, and preferably at least about 70 percent, of the remaining sodium with ammonium ions.

The chemical and/or physical changes which take place during step (2) of the foregoing procedure appear to be primarily responsible for the unique ammonia stability of the final product. As noted above, the unit cell shrinkage which occurs during this step is believed to involve dealumination of the anionic crystal structure. It now appears however that different types of dealumination can take place during this calcination step, depending upon the sodium content of the zeolite from step (1), the steam partial pressure in step (2), and perhaps other factors. Certain thermally and/or hydrothermally stabilized Y zeolites of the prior art, even though displaying a unit cell constant within the ranges produced in step (2) herein, have been found to display markedly inferior stability to ammonia. The ammonia-stable compositions of this invention hence appear to be the result of achieving the necessary unit cell shrinkage under the proper conditions, principally sufficient steam atmosphere and a sufficient residual sodium content in the zeolite. A given unit cell shrinkage obtained in a substantially dry atmosphere, or in the substantial absence of zeolitic sodium results in much inferior products as compared to a product of the same unit cell constant produced in the presence of steam and zeolite sodium ions. It would hence appear that different types of dealumination take place, perhaps at different sites of the anionic crystal structure, depending upon such factors as hydration and cationic influences.

To illustrate the foregoing, U.S. Pat. No. 3,449,070 to McDaniel et al discloses a thermal stabilization treatment which apparently is carried out under anhydrous conditions to produce a hydrothermally stable product having a unit cell size of from 24.40 to 24.55 A, which is mostly within the range produced herein. However, these products have been fund to display poor ammonia stability. Also, U.S. Pat. No. 3,493,519 to Kerr et al. discloses a stabilization treatment wherein an apparently sodium-free ammonium Y zeolite is calcined in the presence of steam. This product likewise, through hydrothermally stable, has been found to display inferior ammonia stability. the "ultrastable" Y zeolite compositions prepared by the method of U.S. Pat. No. 3,293,192 have been found to be completely unstable to ammonia, due apparently to excessive unit cell shrinkage, as well as possible deficiency in zeolitic sodium and/or steam during the final calcination treatment. Finally, U.S. Pat. No. 3,354,077 to Hansford discloses a steam stabilization treatment under conditions of time, temperature, steam pressure and zeolitic sodium content which overlap the critical combination of those conditions required herein, but there is no teaching of an ammonia-stable product, or of the critical combination of conditions required to produce such a product. Hansford likewise fails to disclose the final ion exchange step required herein.

In addition to high stability, the zeolites of this invention also display unusually high catalytic activity for acidcatalyzed reactions such as cracking, hydrocracking, isomerization, etc, as compared to the stabilized zeolites of the prior art. This is believed to be due primarily to the fact that thermal stabilization in the presence of both steam and sodium ions brings about a higher degree of stabilization for a given degree of unit cell shrinkage than is achieved in the absence of steam, or in the absence of sodium ions. The dealumination of the anionic crystal structure which occurs during stabilization, and which apparently brings about unit cell shrinkage, also results in the destruction of catalytically active ion-exchange sites. It is therefore desirable to effect a maximum of stabilization with a minimum of dealumination, or unit cell shrinkage. The process of the present invention achieves this objective to a substantially greater degree than prior art methods.

From the foregoing, it will be apparent that there are critical limitations upon each of the major steps of my process, and that these limitations are cooperatively interrelated with each other in such manner as to product a final product which is not only hydrothermally stable and ammonia stable, but highly active. To the best of my knowledge, none of the stabilization treatments described in the prior art teach methods for achieving this optimum combination of properties.

For purposes of this invention, a hydrothermally stable zeolite is defined as one which retains at least about 70 percent of its crystallinity after rehydration and calcination for one hour at 900° F. An ammonia-stable zeolite is defined as one which retains at least about 60 percent of its crystallinity after being subjected to the ammonia stability test hereinafter described.

DETAILED DESCRIPTION

Figure 1:
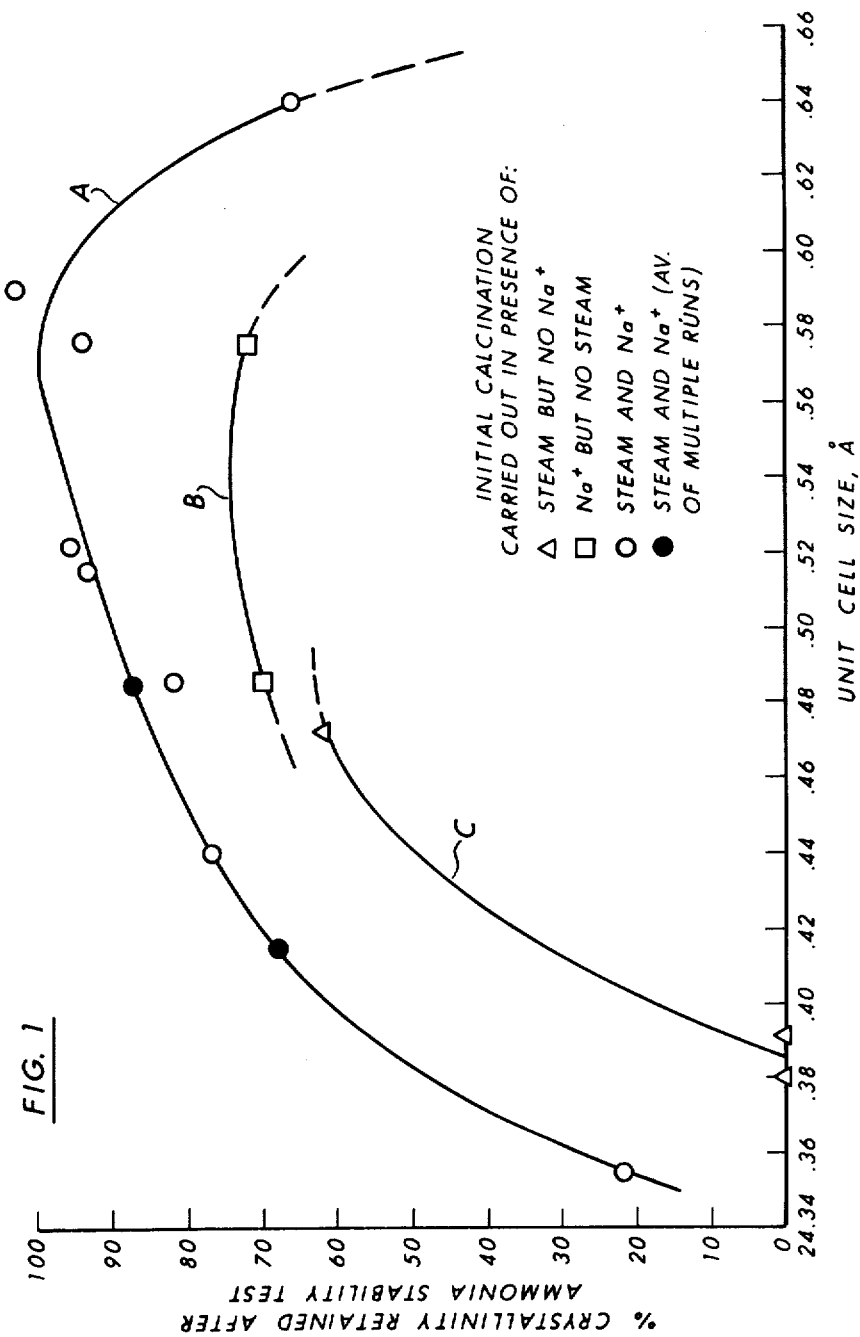

The initial sodium Y zeolite starting material utilized herein ordinarily has a $SiO_2/Al_2O_3$ mole ratio between about 3 and 6, and contains about 10 - 14 weight-percent of sodium as $Na_2O$. In the initial ammonium ion exchange step, the sodium zeolite is digested in conventional manner with an aqueous solution of a suitable ammonium salt such as the chloride, nitrate, sulfate, carbonate, acetate, etc, to replace at least 20 percent, preferably at least about 50 percent but not more than about 95 percent, of the original sodium ions with ammonium ions. The sodium content should be reduced to about 0.6 - 5 percent, preferably about 1 - 4 percent by weight as $Na_2O$. At this point the unit cell size of the zeolite is greater than 24.64 A, usually between about 24.65 and 24.75 A.

Following the initial exchange treatment, I have found that in order to produce a composition having the desired properties outlined above, it is essential that the ammonium-sodium zeolite at this stage be calcined in the presence of a steam, as opposed to calcination under anhydrous conditions. As noted above, both high temperatures and substantial partial pressure of steam are necessary in order to achieve the desired hydrothermal and ammoniastability via dealumination and unit cell shrinkage. The steam treatment also alters the pore size distribution of the zeolite; the initial Y zeolite has uniform pore diameters of about 10-12 A, while in the steamed product a substantial proportion of the pore volume is in pores of greater than 20 A diameter.

For effective stabilization, the calcination should be carried out while maintaining at least about 0.2 psi water vapor pressure, preferably about 2 - 15 psi, and still more preferably about 5 - 15 psi, for a substantial time at temperatures above 600° F. This objective can be realized by any procedure capable of maintaining the desired water vapor partial pressure in contact with the zeolite during at least a substantial portion of the heating. In one modification, the wet zeolite from the exchange step can merely be heated in a covered container so as to retain the water vapor generated therefrom. Alternatively, the zeolite can be introduced into a batch or continuous rotary furnace, or a static bed calcination zone, into which preheated steam or humidified air is introduced. Still another alternative is to heat the wet zeolite, with or without added water, in an autoclave equipped with a pressure relief valve such that super-atmospheric pressures of steam can be maintained therein.

Operative steaming temperatures ranging between about 600° and 1650° F, preferably between about 800° and 1650° F. In any case, the factors of time, temperature and steam partial pressure should be correlated so as to effect the desired stabilization, yet avoid substantial degradation of the crystal structure. The duration of treatment is usually at least about 0.5 minutes, preferably about 10 minutes to about 4 hours, and still more preferably about 0.5 - 4 hours, but in any event is sufficient to reduce the unit cell size to between about 24.40 and 24.64 A, preferably between about 24.42 and 24.62 A. This reduction in unit cell size is a convenient indicia of the degree of stabilization obtained.

The steam calcined zeolite is then reexchanged with ammonium salt solution under sufficiently severe conditions to reduce the remaining zeolitic sodium content of the zeolite to less than 2, preferably less than about 1, and still more preferably less than about 0.6 weight-percent, as $Na_2O$. This ordinarily involves replacing at least 25 percent, preferably at least about 70 percent, of the remaining zeolitic sodium with ammonium ions.

It should be realized that this second exchange step does not introduce any appreciable amount of ammonium ions into the exchange sites which were dehydroxylated in the previous steam calcination step; nearly all of the ammonium ions which go into the zeolite at this point do so by replacing remaining sodium ions. Since for catalytic purposes a substantial ammonium zeolite moiety is desired in the final product for conversion to catalytically active sites of Bronsted acidity, it will be apparent that sufficient sodium should be initially present at the second exchange step, and sufficient of this remaining sodium should be exchanged out with ammonium ion, to provide the ultimately desired Bronsted acidity. For this purpose, the double-exchanged zeolite should contain an amount of ammonium ion corresponding to at least about 5 relative percent, preferably 10–20 percent, of the original ion exchange capacity of the zeolite. While this remaining ion exchange capacity may appear to represent only a small proportion of the original, potentially active sites, it should be emphasized that thes remaining exchange sites are mostly located in the more accessible portions of the crystal structure, and also that a large portion of catalytically active dehydroxylated exchange sites are present.

After drying at temperatures of, e.g., 212° – 400° F, the zeolites produced as above described from highly useful dehydrating agents for gaseous mixtures, particularly gaseous mixtures which may contain ammonia or volatile amines. They are also useful as selective adsorbents for the fractionation of a variety of hydrocarbon mixtures, as well as other organic compounds. They can be used to separate normal paraffins from isoparaffins, aromatic hydrocarbons from paraffins, naphthenes from paraffins, etc. Here again they are especially useful in adsorption processes involving steam regeneration and/or in which ammonia is present during the adsorption or regeneration cycles.

For use as catalysts in acid catalyst reactions such as alkylation, isomerization, cracking, hydrocracking, etc, the stabilized zeolite from the second ammonium ion exchange step is subjected to calcination at temperatures between about 600° and 1500° F, preferably 800° – 1500° F, for a time sufficient to effect substantial deammoniation thereof. Prior to this calcination step, preferably following the second exchange step, the stabilized zeolite is intimately admixed with a finely divided hydrous refractory oxide of a difficulty reducible metal. The term "hydrous" is used to designate oxides having structural surface hydroxyl groups detectable by infra red analysis. The preferred oxides are alumina, silica, magnesia, beryllia, zirconia, titania, thoria, chromia, and combinations thereof such as silica-alumina, silica-magnesia, and the like. Naturally occurring clays comprising silica and alumina may also be utilized, preferably after acid treatment. Synthetic clays, e.g., of the type described in U.S. Pat. No. 3,876,558, are also contemplated. The resulting mixtures may contain between about 0.5 and 98 weight-percent of zeolite, preferably at least about 2 weight-percent, and generally about 2 to about 80 weight-percent, based on the combined dry weight of the zeolite and the metal oxide. The metal oxide can be combined with the zeolite as a hydrous sol or gel, as an anhydrous activated gel, a spray dried powder or a calcined powder. In one modification a sol or solution of the metal oxide precursor such as an alkali metal silicate of aluminate can be precipitated to form a gel in the presence of the zeolite.

When less hydrous forms of the metal oxide are combined with the zeolite, essentially any method of effecting intimate admixture of the components may be utilized. One such method is mechanical admixture, e.g., mulling, which involves admixing the zeolite in the form of a powder with the slightly hydrous, finely divided form of the metal oxide. Minor amounts of water, with or without an acidic peptizing agent such as a strong mineral acid, are usually added to facilitate admixture.

After admixing the hydrous oxide with the zeolite component, it is normally preferable at this point to consolidate the mixture into the granular shape desired for the final catalyst. Conventional tableting, prilling, or extruding procedures may be utilized to produce tablets, prills or extrudate pellets having a diameter of about 1/32 inch to ⅜ inch. Other conventional pelleting aids may be added such as lubricants, binders, diluents, etc. Macro-granules of this nature are ordinarily utilized in fixed bed processing, but other processes such as fluid catalytic cracking require micro-granules produced for example by conventional spray drying techniques.

It is preferred to maintain a relatively anhydrous environment during this second calcination. If there is substantial water vapor partial pressure during this step, the final catalyst is usually less active than those produced in the substantial absence of water vapor. Accordingly, this calcination is preferably conducted in the presence of less than 2, and preferably less than about 1, psi of water vapor. The calcination may be regarded as complete when substantially all ammonia and physically adsorbed water have been expelled from the catalyst, which, depending on the temperature employed, may range between about 10 minutes and 12 hours or more. The overall severity of this calcination should be controlled to prevent any substantial further shrinkage in the unit cell size of the zeolite; it is essential that the final unit cell size be above 24.40 A, preferably above about 24.44 A.

For use in hydrogenative conversion processes such as hydrocracking, hydroisomerization, etc, the necessary metal hydrogenation component may be distributed selectively on the zeolite component of the catalyst, or on the refractory oxide component. Alternatively it may be distributed more or less equally on both components. Effective hydrogenation components comprise the Group VIB and/or Group VIII metals and their oxides and/or sulfides, with or without other metals such as rhenium. Operative proportions (based on free metal) may range between about 0.1 percent and 30 percent by weight, depending upon the type of metal or metals selected, and the desired activity. In the case of the Group VIII noble metals, amounts in the range of 0.1 to about 2 percent will normally be employed; the iron group metals, iron, cobalt and nickel, are normally utilized in proportions of about 1–10 weight-percent; the Group VIB metals will normally be utilized in proportions of about 3–20 weight-percent. Preferred hydrogenating metals are palladium, platinum, nickel, cobalt, tungsten and molybdenum. Particularly preferred are palladium or platinum, or combinations of nickel and/or cobalt with molybdenum amd/or tungsten.

The hydrogenating component may be added to the catalyst at any desired stage in its manufacture. Preferred methods include impregnation and/or ion-exchange of soluble metal salts into the powdered zeolite after the second ammonium ion exchange, or into the catalyst pellets prior to the final calcination step. Other methods include mixing of soluble or insoluble compounds of the desired metal or metals with the powdered zeolite-hydrous metal oxide mixture prior to extruding or pelleting.

In addition to their low sodium content, the catalysts of this invention are also essentially free of other zeolitic alkali and alkaline earth metal cations, as well as rare earth metals. The presence of any of these zeolitic metal components in amounts exceeding about 1-2 weight-percent is found to substantially reduce the activity of the catalyst for acid catalyzed reactions such as cracking, hydrocracking, isomerization, etc.

The base zeolite compositions described above, or the zeolit-amorphous oxide combinations, are found to be highly active for a wide variety of acid catalyzed hydrocarbon conversions, e.g., cracking, isomerization of n-paraffins to isoparaffins, isomerization of alkyl aromatics, transalkylation of alkyl aromatics, alkylation, etc. For these purposes, a hydrogenation component is not ordinarily necessary, although in paraffin isomerization a hydrogenation component is sometimes desirable. For catalytic cracking, the preferred compositions comprise about 2 to 25 weight-percent of the zeolite component, and 75 - 98 weight-percent of the refractory oxide component. In fluid catalytic cracking employing such catalysts, excellent conversions of gas oils to gasoline are obtainable under conventional cracking conditions, including temperatures of about 850°- 1000° F, at 0-50 psig. Since catalytic cracking feedstocks ordinarily contain from about 10-2000 ppm of organic nitrogen, the ammonia-stable catalysts of this invention find particular utility in that area.

The catalysts containing a hydrogenating component are particularly useful for hydrocracking. Feedstocks which may be directly subjected to hydrocracking herein include in general any mineral oil fraction boiling between about 200° and 1400° F, preferably 350° - 1200° F. For best results the feed should contain less than about 10 ppm, preferably less than about 5 ppm of organic nitrogen. The usual feedstocks include straight run gas oils, coker distillate gas oils, deasphalted crude oils, cycle oils derived from catalytic or thermal cracking operations, and the like, any of which may if necessary have been subjected to suitable pretreatment to reduce the organic nitrogen content to the desired levels. The hydrocracking can be successfully continued for periods of at least about 60 days in the presence of between about 5 and 5,000 ppm, but more conventionally between about 50 - 2000 ppm by weight of ammonia, based on feed. The usual products from hydrocracking include gasoline, diesel fuels, turbine fuels, propane-butane fuels, and the like. Suitable hydrocracking conditions may be selected within the following ranges.

| | Hydrocracking Conditions | |
|---|---|---|
| | Broad Range | Preferred Range |
| Temperature, ° F. | 450 – 850 | 550 – 800 |
| Total Pressure, psig(1) | 400 – 3000 | 600 – 2000 |
| LHSV | 0.2 – 10 | 1 – 5 |
| H$_2$/Oil Ratio, MSCF/B | 0.5 – 15 | 1 – 10 |

(1)At least about 75 percent of which should be hydrogen partial pressure.

It is particularly noteworthy that the hydrocracking catalysts of this invention are especially useful for low-pressure hydrocracking, i.e., at hydrogen pressures between about 400 and 1,000 psi. They deactivate at much lower rates at these low pressures than the best zeolite-based catalysts of the prior art.

In cases where the initial feedstock contains more than about 10 ppm of organic nitrogen, an integral hydrofining-hydrocracking system may be utilized. In this procedure, the feedstock is first subjected to a conventional catalytic hydrofining treatment, and the effluent therefrom, without intervening treatment to remove ammonia, is directly subjected to the above described hydrocracking procedure.

The following examples 1-15 are cited to demonstrate the superior ammonia stability and hydrothermal stability of the catalysts of this invention.

Figure 2:
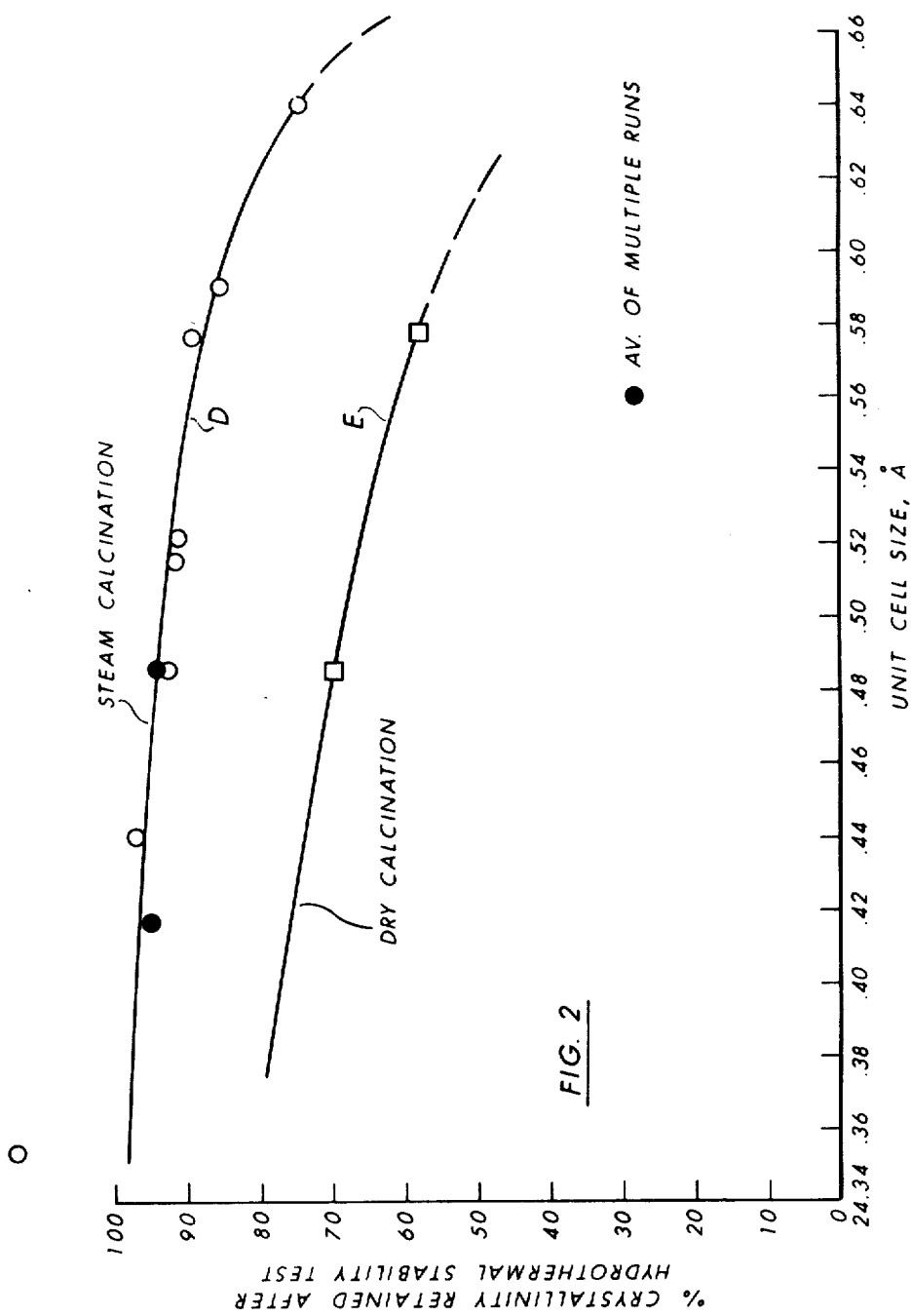

FIGS. 1 and 2 indicate retained crystallinity in Examples 1-10.

EXAMPLES 1-12

In these examples, the starting material was a substantially 100% crystalline ammonium Y zeolite containing about 2.4 weight-percent of residual zeolitic Na$_2$O and having a unit cell size of about 24.703 A. Samples of this starting material were subjected to the following steps in sequence:

1. An initial calcination under various conditions tabulated below;
2. Standard X-ray analysis for crystallinity and unit cell size;
3. Identical ammonium ion exchange treatments with ammonium nitrate solutions to reduce the zeolitic Na$_2$O content to below about 0.3 weight-percent;
4. Partial drying at 100°-110° C to reduce the water content to about 25 weight-percent.
5. Standard X-ray analysis for crystallinity;
6. Calcination at 900° F for one hour in air;
7. Standard X-ray analysis for crystallinity (to determine hydrothermal stability);
8. Rehydration to about 20 weight-percent H$_2$O, followed by reammoniation to saturation with gaseous NH$_3$ at room temperature, and removal of excess ammonia by purging with nitrogen for 16 hours at room temperature;
9. Calcination at about 930° F for one hour in flowing air; and
10. Standard X-ray analysis for crystallinity (to determine ammonia-stability).

The results of the tests were as follows:

Table 1

| | Initial Calcination | | | | Percent of Crystallinity Retained at | |
|---|---|---|---|---|---|---|
| Example | Hrs. | Temp., ° F | H$_2$O psi | Unit Cell Size, A | Step 7(a) | Step 10(b) |
| 1 | 1 | 752 | 15 | 24.640 | 75 | 66 |
| 2 | " | 932 | 15 | 24.590 | 85 | 103 |
| 3 | " | 1022 | 15 | 24.576 | 89 | 94 |
| 4 | " | 1112 | 15 | 24.521 | 91 | 95 |
| 5 | " | 1202 | 15 | 24.518 | 92 | 93 |

Table 1-continued

| Example | Initial Calcination | | | | Percent of Crystallinity Retained at | |
|---|---|---|---|---|---|---|
| | Hrs. | Temp., °F | H₂O psi | Unit Cell Size, A | Step 7(a) | Step 10(b) |
| 6(c) | " | 1292 | 15 | 24.486 | 94 | 87 |
| 7 | " | 1382 | 15 | 24.486 | 93 | 82 |
| 8(d) | " | 1472 | 15 | 24.418 | 95 | 69 |
| 9 | 3 | 1292 | 15 | 24.440 | 97 | 77 |
| 10 | 3 | 1472 | 15 | 24.354 | 114 | 22 |
| 11 | 1 | 1292 | ~0 | 24.578 | 56 | 72 |
| 12 | 1 | 1472 | ~0 | 24.486 | 70 | 70 |

(a)Based on crystallinity found at step (5).
(b)Based on crystallinity found at step (7).
(c)Average of 5 runs.
(d)Average of 3 runs.

The above data for crystallinity retained at step (10) (Examples 1-10) is plotted versus unit cell size in the accompanying FIG. 1, giving curve A, which represents the percent of crystallinity which survived the ammonia stability test. Curve B depicts the analogous data for Examples 11 and 12. It is evident that, for a given unit cell size, the steam calcination of Examples 1-10 gives products of substantially superior ammonia-stability, as compared to the dry calcination of Examples 11 and 12. The succeeding Examples 13-15 will show however that this desirable result is not obtained when the zeolite is essentially free of sodium during the steam calcination.

The above data for crystallinity retained at step (7) (Examples 1-10) is plotted versus unit cell size in FIG. 2, giving curve D, which represents the percent of crystallinity whih survived the hydrothermal stability test. Curve E depicts the analogous data for Examples 11 and 12. It is evident that to obtain a given degree of hydrothermal stability, considerably more unit cell shrinkage (and loss of exchange sites) is required when steam is not present during the initial calcination.

EXAMPLES 13-15

In these Examples the starting material was a substantially 100% crystalline ammonium Y zeolite which has been exhaustively ion-exchanged to a sodium content of 0.04 weight-percent as Na. Three samples of this material were subjected to the following steps in sequence:
1. Steam calcination under conditions tabulated below;
2. Standard X-ray analysis for crystallinity and unit cell size;
3. Rehydration to about 20 weight-percent H₂O, followed by reammoniation to saturation with gaseous NH₃ at room temperature and removal of excess ammonia by purging with nitrogen for 16 hours;
4. Calcination at about 930° F for 1 hour in flowing air; and
5. Standard X-ray analysis for crystallinity (to determine ammonia-stability).

The results of the tests were as follows:

Table 2

| | Calcination | | | | |
|---|---|---|---|---|---|
| Example | Hrs. | Temp., °F | H₂O psi | Unit Cell Size, A | Percent of Crystallinity Retained at Step 5(a) |
| 13 | 1 | 1000 | 15 | 24.472 | 62 |
| 14 | 1 | 1200 | 15 | 24.391 | 0 |
| 15 | 1 | 1300 | 15 | 24.380 | 0 |

(a)Based on crystallinity found at step (2).

The above data for crystallinity retained at step (5) is plotted versus unit cell size in FIG. 1, giving Curve C, which represents the percent of crystallinity which survived the ammonia-stability test. It is evident that in the absence of sodium, steam calcination is a relatively ineffective stability treatment.

The following Examples 16-28 are cited to illustrate the superior hydrocracking activity of the catalysts of this invention, but are not to be construed as limiting in scope:

EXAMPLES 16-19

Preparation of Catalysts

Catalyst A: Sodium Y zeolite was ion exchanged with ammonium sulfate solution until the sodium content was reduced to 1.5 – 2 weight-percent Na₂O. The resulting ammonium-sodium zeolite was then calcined in flowing steam for 1 hour at 1292° F and then further ion exchanged with ammonium salt solution until the sodium content was reduced to less than 0.2 percent Na₂O. The resulting product was then slurried in dilute ammonium hydroxide, into which a solution of palladium chloride in dilute ammonium hydroxide was slowly stirred. The product was washed free of chloride, mixed with 20 weight-percent (dry basis) of acid-peptized alumina, extruded into ⅛ inch pellets, dried and calcined at about 900° F for 1 hour. The finished catalyst contained about 0.5 weight-percent Pd, and the unit cell size of the zeolite was 24.483 A.

Catalyst B: A sample of Davison ultrastable zeolite Z-14US was composited with 0.5 weight-percent Pd and 20 percent Al₂O₃ as described above to give a product with a unit cell size of 24.337 A. The Z-14US zeolite was prepared by the double-exchange, double-calcination procedure described in U.S. Pat. No. 2,293,192, i.e., with a first ammonium ion exchange to reduce the sodium content to about 3 weight-percent Na₂O followed by calcination at about 1000° F, reexchange to reduce the sodium content to below 1 percent Na₂O, and a final calcination at about 1560° F.

Catalyst C: Sodium Y zeolite was ammonium ion exchanged, steam calcined and again ammonium exchanged as described in the catalyst A procedure. The resulting product was then dried and mulled with acid-peptized alumina gel, nickel carbonate, ammonium heptamolybdate and sufficient concentrated nickel nitrate solution to provide a moist, extrudable paste. The proportions of ingredients were such as to provide a finished catalyst to about the following weight-percent composition:

|  |  |
|---|---|
| Zeolite | 60 |
| $Al_2O_3$ gel | 20 |
| MoO3 | 15 |
| NiO | 5 |

The mulled mixture was then extruded into 1/18 inch pellets, dried and calcined at 900° F for 1 hour.

Catalyst D was a more conventional Pd-Y zeolite catalyst comprising a copelleted composite of 20 weight-percent alumina, 80 weight-percent of a magnesium back-exchanged hydrogen Y zeolite (3 weight-percent MgO), and 0.5 weight-percent of Pd. This catalyst had not been subjected to hydrothermal stabilization, but was hydrothermally stable by virtue of is zeolitic magnesium content.

EXAMPLES 20-23

Catalysts A, B, C and D above were ground to 14-20 mesh particles and compared for hydrocracking activity using as feed an unconverted gas oil derived from a previous hydrofining-hydrocracking run, having an API gravity of 38°, and a boiling range of 360°-870° F, with about 12 percent boiling below 400° F. For test purposes, the feed was doped with 0.5 weight-percent sulfur as thiophene and 0.2 weight-percent nitrogen as tert-butylamine. Each catalyst was tested at hydrogen pressures of about 1450 and 500 psi, each run being carried out at LHSV 1.7, $H_2$/oil ratio of 8000 SCF/B, with temperatures periodically adjusted to maintain a total liquid product gravity of 47° API. By previously established correlations, this product gravity corresponds to a conversion of about 38 volume-percent to $C_4$-400° F gasoline (after deducting the 12 volume-percent of feed which boiled below 400° F). The respective temperatures required to maintain this conversion after 100 hours on stream were as follows:

Table 3

| Catalyst | Temperatures for 38% Conversion, ° F | |
|---|---|---|
|  | 1450 psi | 500 psi |
| A | 689 | 736 |
| B | 712 | 742 |
| C | 707 | 724 |
| D | 722 | 840+ [1] |

[1] Catalyst was deactivating so rapidly that only about 23 percent conversion was being obtained. TIR was about 22° F per day with no apparent leveling out.

Since a reduction of about 20° F in temperature required to maintain conversion corresponds to about doubling the catalyst activity (on a catalyst volume basis), it will be apparent that catalysts A and C of this invention were substantially superior to catalysts B and D of the prior art. Catalyst C was particularly outstanding at 500 psi, while catalyst A was particularly outstanding at 1450 psi (the "TIR" notation above refers to the average daily temperature increase required for maintaining the stated conversion level.)

EXAMPLES 24-26

Catalysts A, B and D were tested as described in Examples 20-23, using the same feed except for the omission of the added tert-butylamine. In this case however, temperatures were adjusted to maintain a product gravity of 49.5° API, which corresponds to a conversion of about 48 volume-percent to $C_4$-400° F gasoline. At 1450 psi, the results were as follows:

Table 4

| Catalyst | Temperature for 48% Conversion, ° F |
|---|---|
| A | 510 |
| B | 538 |
| D | 550 |

It will be seen that at 1450 psi, catalyst A was substantially superior to either of the prior art catalysts B or D.

EXAMPLE 27

Catalyst C was used to hydrocrack another hydrofined gas oil having an API gravity of 35° and a boiling range of 175°-716° F, with about 9% boiling below 400° F. The feed contained about 1 ppm nitrogen and 12 ppm sulfur.

The catalyst was presulfided with a $H_2$/$H_2S$ mixture and evaluated at 950 psig, and at 3.0 and 1.7 LHSV. $H_2$/oil ratio was 8000 SCF/B. The temperature was periodically adjusted to maintain a total product gravity of 60.5° API, corresponding to a conversion of about 80 volume percent per pass to $C_4$-400° F gasoline (after deducting the 9 volume-percent of feed boiling below 400° F).

After 250 hours on stream at 3.0 LHSV, the temperature required to maintain conversion was about 660° F and the deactivation rate was about 2.5° F per day. After 300 hours on stream the deactivation rate was about 1.2° F per day. After a further 160 hours on stream at 1.7 LHSV the deactivation rate was less than 0.3° F per day, and the temperature required to maintain 80% conversion to 400° F end point gasoline was 642° F.

From this data, it can be deduced that a commercial operation of greater than 6 months duration is feasible using the above conditions.

EXAMPLE 28

Operation as in Example 27 was continued at 700 psig and 1.7 LHSV. After a further 140 hours on stream, the required temperature for 80% conversion was 670° F, and the deactivation rate was less than 0.5° F per day.

Examples 24-28 demonstrate that, even in the absence of ammonia, the catalysts of this invention are substantially more active than the prior art catalysts.

EXAMPLES 29-31

Catalytic Cracking

These cracking catalysts were prepared as follows:

Catalyst E: Sodium Y zeolite was ion exchanged with ammonium sulfate solution until the sodium content was reduced to 1.5-2 wt.% $Na_2O$. The resulting ammonium-sodium zeolite was then calcined in flowing steam for 1 hour at 1292° F and then further ion exchanged with ammonium salt solution until the sodium content was reduced to less than 0.2% $Na_2O$. The resulting product had a unit cell size of about 24.486 A.

About 15 wt.% of the resulting stabilized zeolite and 85% gamma alumina were mixed together with water to form a stiff paste, which was cast into 1/32 × 1/16" pellets. The resulting product was calcined at 900° F.

Catalyst F: The procedure used for Catalyst E was repeated except that the zeolite component was Davison Ultrastable Zeolite Z-14US, having a unit cell size of about 24.337 A.

Catalyst G: The procedure used for Catalyst E was repeated except that the zeolite component was a Y zeolite which had been exhaustively ammonium-ion exchanged to a sodium content of about 0.15% Na$_2$O (unit cell size about 24.809 A).

The foregoing catalysts, after steaming at 1380° F, were then tested for cracking activity, using as feed a mixed virgin-coker gas oil boiling between about 400° and 950° F, having a gravity of 22.5° API, a sulfur content of 1.5 wt.% and a nitrogen content of 0.314 wt.%. The test runs were carried out at 950° F and about 14.0 WHSV, with a catalyst/oil ratio of about 5.4. The averaged results of three runs for each catalyst were as follows:

Table 5

|  | Catalyst | | |
|---|---|---|---|
|  | E | F | G |
| Total Conversion Vol.% | 57.3 | 55.2 | 39.4 |
| Conversion to 400° F E.P.Gaso, Vol.% | 39.4 | 38.9 | 27.5 |
| Carbon, Wt.% of Feed | 6.3 | 5.5 | 6.2 |
| C$_1$-C$_3$, SCF/B | 304 | 306 | 232 |
| C$_4$ Olefins, Vol.% | 9.2 | 8.7 | 4.7 |
| Iso C$_4$, Vol.% | 2.9 | 2.5 | 0.7 |

It will be seen from the above that Catalyst E is, in a competitive fuel economy, significantly more active than Catalysts F and G. In addition, as the previous Examples have shown, Catalyst E is substantially more stable to ammonia and steam than are Catalysts F and G, which is a very important factor in the catalytic cracking of nitrogen-containing feeds, followed by conventional steam stripping and regeneration of the deactivated catalyst.

The following claims and their obvious equivalents are intended to define the true scope of the invention.

I claim:

1. A process for the catalytic cracking of a hydrocarbon feedstock to produce lower boiling hydrocarbons, which comprises contacting said feedstock, under non-hydrogenative cracking conditions, with a cracking catalyst comprising a major proportion of a refractory oxide of a difficulty reducible metal, and intimately admixed therewith a minor proportion of an ammonia-stable Y zeolite composition prepared by the steps of:
    1. calcining an ammonium-sodium Y zeolite containing about 0.6 – 5 weight-percent of sodium as Na$_2$O, said calcining being carried out at a temperature between about 600° and 1650° F in contact with at last about 0.2 psi of water vapor for a sufficient time to substantially reduce the unit cell size of said zeolite and bring it to a value between about 24.40 and 24.64 A;
    2. subjecting the calcined zeolite to further ammonium ion exchange under conditions adjusted to replace at least about 25 percent of its residual zeolitic sodium ions with ammonium ions and produce a final product containing less than about 1 weight-percent Na$_2$O; and
    3. calcining the product from step (2) at a temperature between about 600° and 1500° F for a time sufficient to effect substantial deammoniation, but insufficient to reduce the unit cell size thereof to below about 24.40 A.

2. A process as defined in claim 1 wherein said refractory oxide is selected from the class consisting of alumina, silica-alumina, silica-magnesia, and natural and synthetic clays.

3. A process as defined in claim 1 wherein said refractory oxide is admixed with said Y zeolite composition prior to step (3).

4. A process as defined in claim 3 wherein said refractory oxide is selected from the class consisting of alumina, silica-alumina, silica-magnesia, and natural and synthetic clays.

5. A process as defined in claim 1 wherein step (3) is carried out under substantially dry conditions.

6. A process for the catalytic cracking of a gas oil feedstock to produce gasoline boiling range hydrocarbons, which comprises contacting said feedstock, under non-hydrogenative cracking conditions, with a cracking catalyst comprising a major proportion of a refractory oxide of a difficulty reducible metal, and intimately admixed therewith a minor proportion of an ammonia-stable Y zeolite composition prepared by the steps of:
    1. calcining an ammonium-sodium Y zeolite containing about 1 – 4 weight-percent of sodium as Na$_2$O, said calcining being carried out at a temperature between about 800° and 1650° F in contact with between about 2–15 psi of water vapor for a sufficient time to substantially reduce the unit cell size of said zeolite and bring it to a value between about 24.42 and 24.62 A;
    2. subjecting the calcined zeolite to further ammonium ion exchange under conditions adjusted to replace at least about 70 percent of its residual zeolitic sodium ions with ammonium ions and produce a final product containing less than about 0.6 weight-percent Na$_2$O; and
    3. calcining the product from step (2) at a temperature between about 800° and 1500° F for a time sufficient to effect substantial deammoniation, but insufficient to reduce the unit cell size thereof to below about 24.40 A.

7. A process as defined in claim 6 wherein said refractory oxide is selected from the class consisting of alumina, silica-alumina, silica-magnesia, and natural and synthetic clays.

8. A process as defined in claim 6 wherein said refractory oxide is admixed with said Y zeolite composition prior to step (3).

9. A process as defined in claim 8 wherein said refractory oxide is selected from the class consisting of alumina, silica-alumina, silica-magnesia, and natural and synthetic clays.

10. A process as defined in claim 6 wherein step (3) is carried out under substantially dry conditions.

* * * * *